(12) United States Patent
Ruething et al.

(10) Patent No.: US 7,932,583 B2
(45) Date of Patent: Apr. 26, 2011

(54) REDUCED FREE-CHARGE CARRIER LIFETIME DEVICE

(75) Inventors: Holger Ruething, Munich (DE); Hans-Joachim Schulze, Ottobrunn (DE); Frank Hille, Munich (DE); Frank Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 492 days.

(21) Appl. No.: 12/119,751

(22) Filed: May 13, 2008

(65) Prior Publication Data
US 2009/0283799 A1 Nov. 19, 2009

(51) Int. Cl.
*H01L 29/739* (2006.01)
*H01L 21/8222* (2006.01)

(52) U.S. Cl. ......... 257/577; 257/590; 257/E21.383; 257/E29.197; 438/328; 438/378

(58) Field of Classification Search .......... 257/577, 257/590, 143, 156, 376, E21.383, E29.197; 438/328, 378, 370
See application file for complete search history.

(56) References Cited

U.S. PATENT DOCUMENTS
| | | | |
|---|---|---|---|
| 5,360,984 A | 11/1994 | Kirihata | |
| 6,404,045 B1 | 6/2002 | Pelly | |
| 6,774,407 B2 * | 8/2004 | Kushida | 257/131 |
| 2005/0006796 A1 | 1/2005 | Falster | |
| 2005/0258493 A1 * | 11/2005 | Aono et al. | 257/370 |
| 2006/0073684 A1 | 4/2006 | Schulze et al. | |
| 2007/0231973 A1 | 10/2007 | Ruthing et al. | |

FOREIGN PATENT DOCUMENTS
| | | |
|---|---|---|
| DE | 10337457 B3 | 1/2005 |
| DE | 102005018366 | 4/2005 |

OTHER PUBLICATIONS
Vobecky, J., et al., "Free-Wheeling Diodes with Improved Reverse Recovery by Combined Electron and Proton Irradiation," Proceedings of the 8th PEMC, Sep. 8-10, 1998, pp. 1-4.
Hellmund, Oliver, et al., "Optimize losses in soft-switching applications," Electronic Engineering Times-Asia, Nov. 1-15, 2006, pp. 1-2.

* cited by examiner

*Primary Examiner* — Victor Mandala
*Assistant Examiner* — Scott Stowe
(74) *Attorney, Agent, or Firm* — Coats & Bennett, P.L.L.C.

(57) ABSTRACT

According to one embodiment, a semiconductor device comprises a body of a first conductivity type having a source region and a channel, the body being in contact with a top contact layer. The device also comprises a gate arranged adjacent the channel and a drift zone of a second conductivity type arranged between the body and a bottom contact layer. An integrated diode is formed partially by a first zone of the first conductivity type within the body and being in contact with the top contact layer and a second zone of the second conductivity type being in contact with the bottom contact layer. A reduced charge carrier concentration region is formed in the drift zone having a continuously increasing charge carrier lifetime in the vertical direction so that the charge carrier lifetime is lowest near the body and highest near the bottom contact layer.

19 Claims, 12 Drawing Sheets

REDUCED FREE-CHARGE CARRIER LIFETIME DEVICE

BACKGROUND OF THE INVENTION

Insulated-Gate Bipolar Transistors (IGBTs) are three-terminal power semiconductor devices that combine the gate-drive characteristics of a Metal Oxide Semiconductor Field-Effect Transistor (MOSFET) with the high-current and low-saturation-voltage capability of a bipolar transistor. Modern IGBT devices are formed by integrating a FET and a bipolar power transistor on the same silicon die. The FET functions as a control input while the bipolar power transistor is used as a switch. IGBTs efficiently switch electric power in many applications such as electric motors, variable speed refrigerators, air-conditioners, etc. However, these applications have considerably high inductive loads which can cause current to flow in a reverse direction of the switch. If this reverse current is commutated into the IGBT, the device will be destroyed. Therefore, diodes can be used to conduct this reverse current and thereby protect the IGBT.

One technique to enable the IGBT to conduct the reverse current is to integrate a freewheeling diode into the IGBT device. The collector electrode of the IGBT is divided into different regions of n and p-type material. The p-type regions form the IGBT collector. The n-type regions, in conjunction with the n-type drift zone of the IGBT device, form a free-wheeling diode with the p-body and a heavily doped p-type anti-latchup region of the IGBT device.

Integrating a freewheeling diode with an IGBT device creates some problematic conditions. Mainly, power continues to dissipate in a freewheeling diode in conduction mode and even after it has been reverse biased. Current will continue to flow until the diode reaches a steady-state reverse bias condition. The condition when the diode changes from forward conduction to blocking is commonly referred to as reverse recovery. The Reverse Recovery Charge (RRC) causes the integrated freewheeling diode to incur electrical losses. These electrical losses increase when the diode is integrated in the IGBT. Some applications cannot tolerate the resulting elevated temperature and/or power conditions. In addition, the elevated temperature and power consumption reduces the lifetime of the IGBT.

Electrical losses caused by integrating a freewheeling diode with an IGBT device can be lowered by reducing the RRC of the diode. Diode RRC can be lowered by reducing the concentration of free-charge carriers within the IGBT device in diode mode. Most free-charge carriers originate within the IGBT device from the highly doped anti-latchup p-type region of the device. This highly doped region injects free-charge carriers into the drift zone of the IGBT device in diode mode. Accordingly, the diode RCC can be reduced by lowering the doping concentration of the highly doped anti-latchup p-type region. However, this significantly reduces the latch-up robustness of the IGBT device and is not a practical solution for most IGBT applications because IGBT performance degrades.

Some conventional approaches involve forming a single or local reduced charge-carrier lifetime region in the drift zone of the IGBT device. This single region must have a very low charge carrier lifetime to sufficiently reduce the RCC of the freewheeling diode integrated with the IGBT device. A single reduced charge-carrier lifetime region is typically formed by irradiating either the front or back side of the wafer on which the IGBT device and freewheeling diode are fabricated. The irradiation treatment may result in two zones being formed within the single reduced charge-carrier lifetime region. One zone has a charge carrier lifetime that is higher than that of the second zone, but lower than that of the non-irradiated part of the IGBT drift zone. However, the single region must still have a very low charge carrier lifetime to be effective at reducing diode RRC. Forming a very low charge carrier lifetime region in the drift zone of an IGBT increases the $V_{CESat}$ (collector-to-emitter saturation voltage) of the IGBT and also leakage current during blocking mode. Moreover, the circuit designer must still trade-off between high emitter efficiency and low diode RRC. Forming a single reduced charge-carrier lifetime region conventionally yields a stored charge that is at least three times higher than that of a single non-freewheeling diode.

SUMMARY OF THE INVENTION

According to one embodiment, a semiconductor device an insulated-gate bipolar transistor having a body region of a first conductivity type, a gate arranged adjacent the body region, a first highly-doped contact region of the first conductivity type arranged in the body region and in contact with a top contact layer, a drift zone of a second conductivity type arranged below the body region, and a second highly-doped contact region of the first conductivity type arranged between the drift zone and a bottom contact layer. The device also comprises a diode having an anode at least partially formed by the body region and a cathode at least partially formed by one or more regions of the second conductivity type formed in the second highly-doped contact region. An irradiation zone is formed in the drift zone. The irradiation zone comprises at least two end of range regions and a reduced charge carrier lifetime region arranged between adjacent end of range regions and between a surface of the drift zone through which the irradiation zone is formed and the end of range region nearest the surface, wherein the reduced charge carrier lifetime regions and the end of range regions each have a charge carrier lifetime lower than that of a non-irradiated region of the drift zone.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
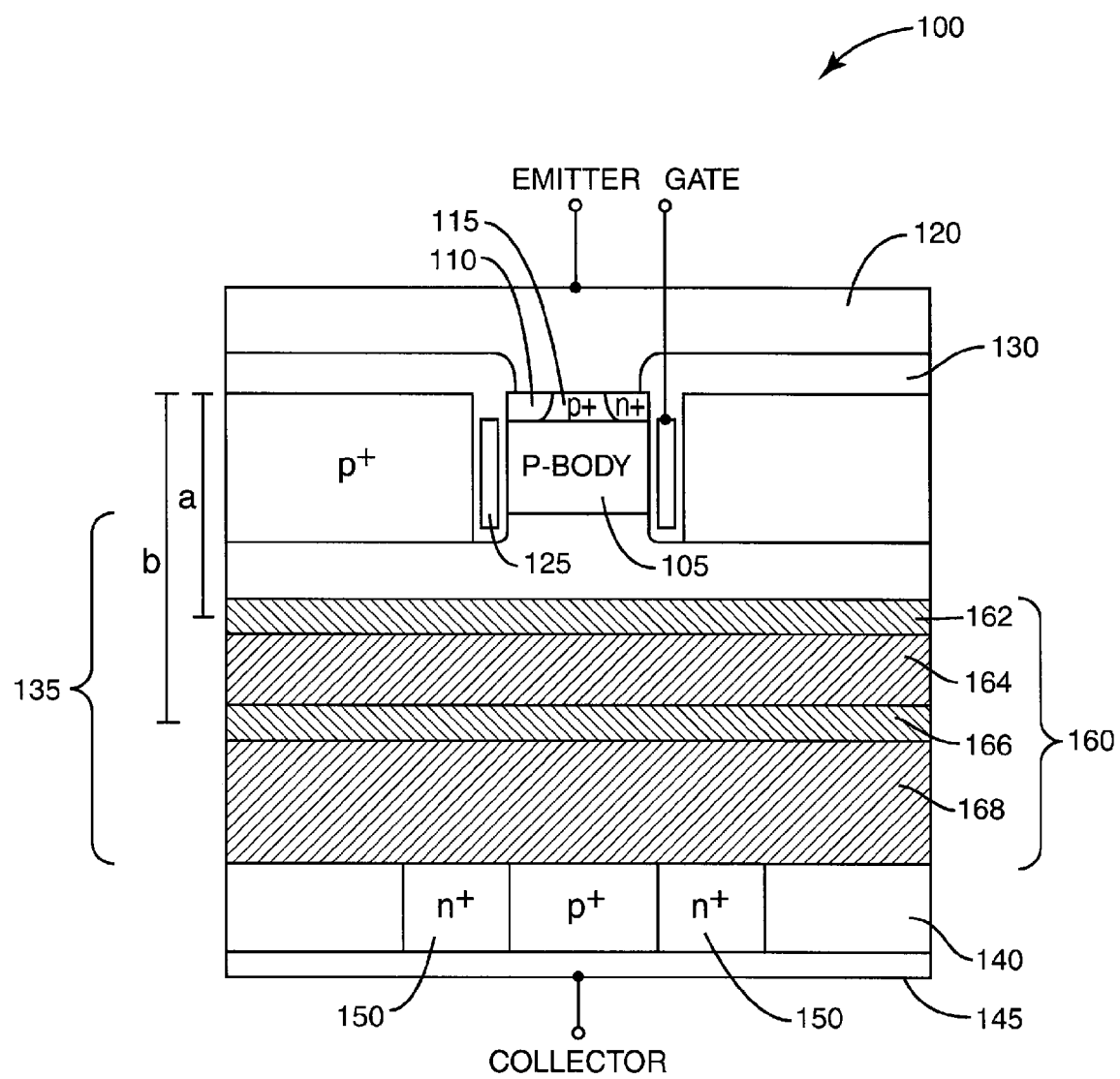
FIG. 1 is a block diagram of an embodiment of a power semiconductor device including an IGBT having an irradiation zone formed by multiple irradiation treatments.

FIG. 1 illustrates an embodiment of a power semiconductor device 100 after at least two irradiation treatments. Device 100 includes an Insulated-Gate Bipolar Transistor (IGBT) integrated with a freewheeling diode, together referred to herein as a reverse conducting IGBT (RC-IGBT). The IGBT has a body region 105 of a first conductivity type, e.g., p-type. The body region 105 includes a source region 110 of the opposite conductivity type (e.g., n-type) and a channel. A heavily doped p-type anti-latchup region 115 is arranged in the body region 105 between the source regions 110 and in contact with an emitter contact layer 120. A gate 125 is arranged adjacent the channel and is separated from the channel and emitter contact layer 120 by an oxide layer 130. The IGBT also has an n-type drift zone 135 arranged below the body region 105. A p+ collector contact region 140 is arranged between the drift zone 135 and a collector contact layer 145, completing the IGBT.

The freewheeling diode integrated with the IGBT has an anode at least partially formed by the body region 105 and the p+ anti-latchup region 115 of the IGBT. The cathode of the freewheeling diode is at least partially formed by one or more n-type regions 150 formed in the p+ doped collector contact region 140. However, unless the RRC of the freewheeling diode is reduced, the diode may adversely affect IGBT performance.

To this end, an irradiation zone 160 is formed in the drift zone 135 by irradiating the drift zone 135 with at least two irradiation treatments of differing energy levels. In one embodiment, the drift zone 135 is irradiated with protons. In another embodiment, the drift zone 135 is irradiated with helium atoms. Regardless, the irradiation zone 160 has an overall charge carrier lifetime lower than that of the drift zone 135 to reduce diode RRC. In one embodiment, the first irradiation treatment applied to the drift zone 135 is performed at an energy level greater than that of the subsequent irradiation treatment(s). Irradiating the drift zone 135 at two (or more) different energy levels yields at least two end of range regions 162, 166.

Each end of range region 162, 166 is formed in the drift zone 135 at a depth corresponding to the energy level of the respective irradiation treatments. FIG. 1 shows a first end of range region 162 formed at a depth a and a second end of range region 166 formed at a depth b. The first end of range region 162 is formed at a high energy level and is located furthest from the irradiated surface (e.g., the bottom surface of the device 100 in this embodiment). The second end of range region 166 is formed at a lower energy level, and thus is located closer to the irradiated surface. Other end of range regions (not shown) may be formed by irradiating the drift zone 135 with additional treatments.

Figure 2:
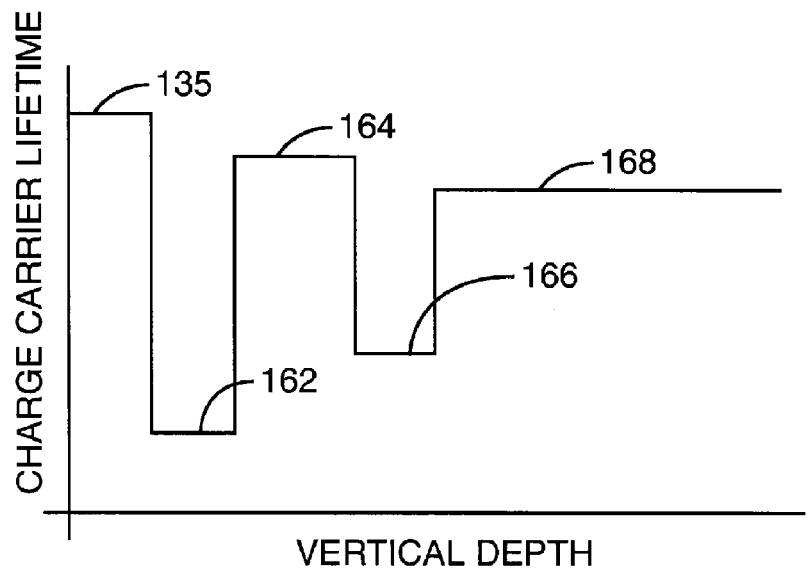
FIG. 2 is a plot diagram illustrating a charge carrier lifetime profile associated with the device of FIG. 1.

The irradiation zone 160 also includes a reduced charge carrier concentration region arranged between adjacent end of range regions and between the surface of the drift zone 135 through which the irradiation zone 160 is formed and the end of range region nearest the irradiated surface. In FIG. 1, a first reduced charge carrier concentration region 164 is arranged between the first and second end of range regions 162, 166. A second reduced charge carrier concentration region 168 is arranged between the irradiated surface and the end of range region 166 nearest the irradiated surface. The reduced charge carrier concentration region 164 furthest from the irradiated surface is irradiated once (during the first irradiation treatment) while the other reduced charge carrier concentration region 168 is irradiated twice (during both the first and second irradiation treatments). Thus, the end of range region 162 furthest from the irradiated surface has a charge carrier lifetime much lower than that of the non-irradiated part of the drift zone 135 and which corresponds to the energy level (depth) and dose (carrier lifetime) of the first irradiation treatment as shown in FIG. 2. The end of range region 166 nearest the irradiated surface also has a charge carrier lifetime much lower than that of the non-irradiated part of the drift zone 135 and which corresponds to the energy level (depth) and dose (carrier lifetime) of both the first and second irradiation treatments as shown in FIG. 2.

Figure 3:
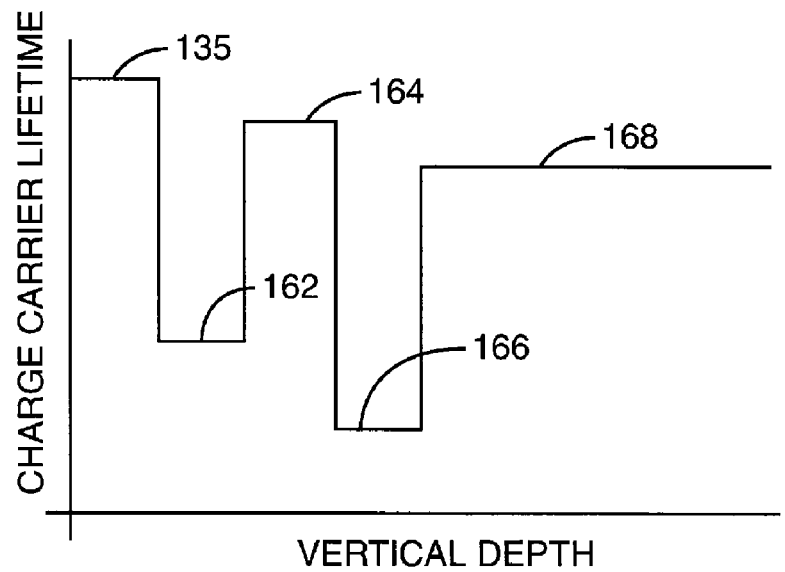
FIG. 3 is a plot diagram illustrating a charge carrier lifetime profile associated with the device of FIG. 1.

The reduced charge carrier concentration region 164 furthest from the irradiated surface has a relatively constant charge carrier lifetime greater than that of the end of range region 162 furthest from the irradiated surface and less than that of the drift zone 135, as shown in FIG. 2. In one embodiment, the charge carrier reduction in region 164 of the irradiation zone 160 is approximately 5% to 20% of that in the end of range region 162 furthest from the irradiated surface. The charge carrier reduction in the reduced charge carrier concentration region 168 nearest the irradiated surface is approximately 5% to 20% of end of range region 162 and approximately 5% to 20% of end of range region 166 because region 168 is irradiated twice. Additional irradiation treatments may be applied to the drift zone 135, yielding additional end of range regions (not shown) and additional reduced charge carrier concentration regions (also not shown) each having different carrier lifetime reductions corresponding to the energy levels and irradiation doses of the respective additional irradiation treatments. FIG. 3 illustrates another embodiment in which the charge carrier lifetime of end of range region 162 is higher than that of end of range region 166. Generally, a greater charge carrier reduction is realized nearer regions 105 and 115 of the device 100, resulting in a suitable RCC of the freewheeling diode even at high diode p-emitter efficiency.

Figure 4:
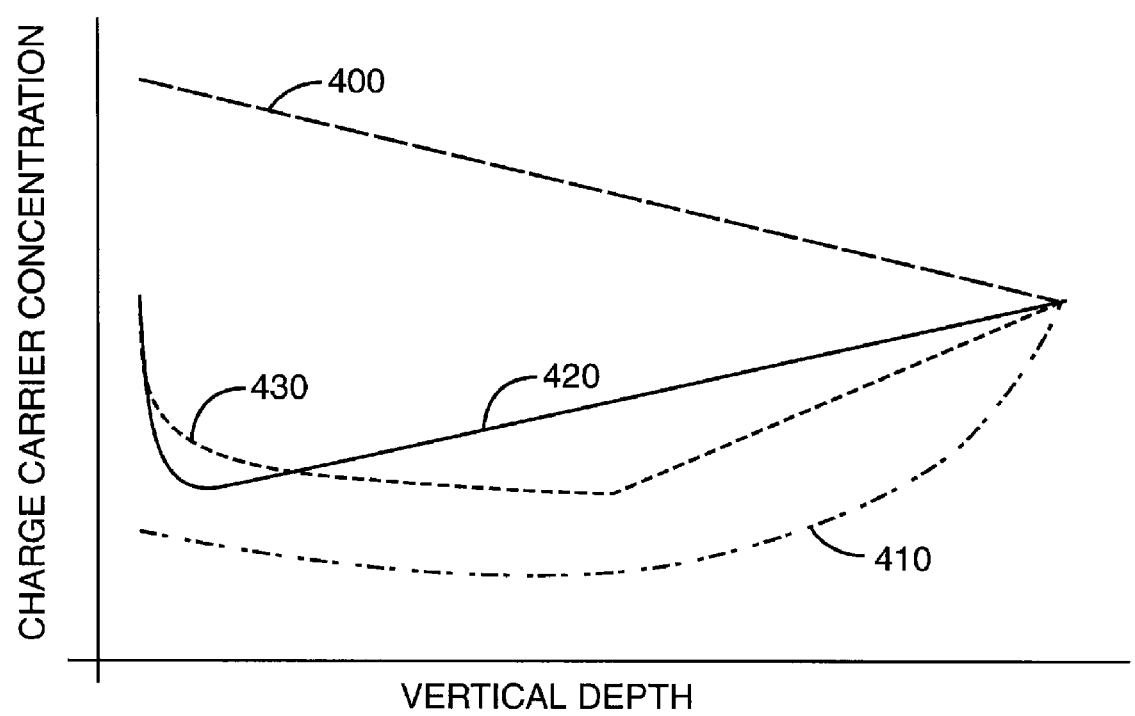
FIG. 4 is a plot diagram illustrating various charge carrier concentration distributions.

FIG. 4 illustrates how the irradiation zone 160 formed in the power semiconductor device 100 maintains high emitter efficiency while reducing diode RRC as a function of charge carrier lifetime. The x-axis represents vertical depth from the device emitter (i.e., IGBT cathode and diode anode) to the device collector (i.e., IGBT anode and diode cathode). The y-axis represents charge carrier concentration of the device 100 in diode mode (i.e., reverse conduction mode). FIG. 4 shows how carrier concentration changes as a function of vertical depth for four different types of semiconductor devices operating in diode mode. The area under each curve represents the RRC of the diode. Diode RRC is influenced by p-emitter efficiency, charge carrier lifetime, current density, temperature, n-emitter efficiency, etc. Curve 400 shows the carrier concentration of an IGBT without any charge carrier lifetime reduction regions. Curve 420 shows the same device after a single irradiation treatment. Curve 430 shows the power device 100 after at least two irradiation treatments according to the various embodiments disclosed herein. For comparison, curve 410 shows the carrier concentration of a single discrete freewheeling diode with a homogeneously-reduced lifetime and lower p-emitter efficiency.

The irradiation zone 160 reduces the overflow of charge carriers on the front side of the RC-IGBT 100 more than on the back side while in IGBT conduction mode. For example, consider a conventional 600 V RC-IGBT after one or no irradiation treatments. Charge carrier overflow at the location of lowest overflow, which is the location with the highest impact on the forward voltage, is not further reduced for such a conventional RC-IGBT device. To the contrary, the various embodiments described herein provide a first irradiation treatment having an intensity that yields a high charge carrier lifetime reduction end of range region 162 near the front side p-n junction of the RC-IGBT. A second irradiation treatment of a lower intensity affects the charge carrier lifetime in the middle of the drift zone 135 or even near the device collector. Thus, the charge carrier concentration near the device collector can be sufficiently increased while still reducing the RRC of the freewheeling diode. This way, a sufficient IGBT collector-emitter saturation voltage (Vce) can be maintained while still reducing the diode RRC. Furthermore, a higher overall charge carrier lifetime is provided by applying at least two irradiation treatments to the device 100 instead of a single irradiation treatment or no treatment at all, lowering leakage current during blocking mode.

The irradiation dose and energy determines the vertical depth and charge carrier lifetime of the different regions 162-168 of the irradiation zone 160. In one embodiment, the end of range region 162 furthest from the irradiated surface is located approximately a=10 µm below the upper surface of the drift zone 135 and approximately 4-8 µm below the p-n junction formed between the body region 105 and drift zone 135. The end of range region 166 nearest the irradiated surface is located, e.g. at approximately half the thickness of the device 100.

Moreover, the end of range region 162 furthest from the irradiated surface can be produced with a proton dose of approximately $10^{11}$ to $10^{12}$ cm$^{-2}$. The end of range region 166 nearest the irradiated surface can be formed by irradiating the power device 100 with approximately 25%-50% of the dose used to form the other end of range region 162. This way, the RRC of the freewheeling diode is reduced without adversely affecting the voltage drop in IGBT mode too much. Reduced charge carrier concentration region 164 has a reduction of the carrier lifetime of 5-20% of that in the end of range region 162. Reduced charge carrier concentration region 168 has a reduction of the carrier lifetime of 5-20% of that in the end of range region 162 plus a further reduction of the carrier lifetime of 5-20% of that in the end of range region 166, because it is irradiated twice. When helium irradiation is used in place of proton irradiation, the doses identified immediately above can be reduced by approximately 90%.

Figure 5:
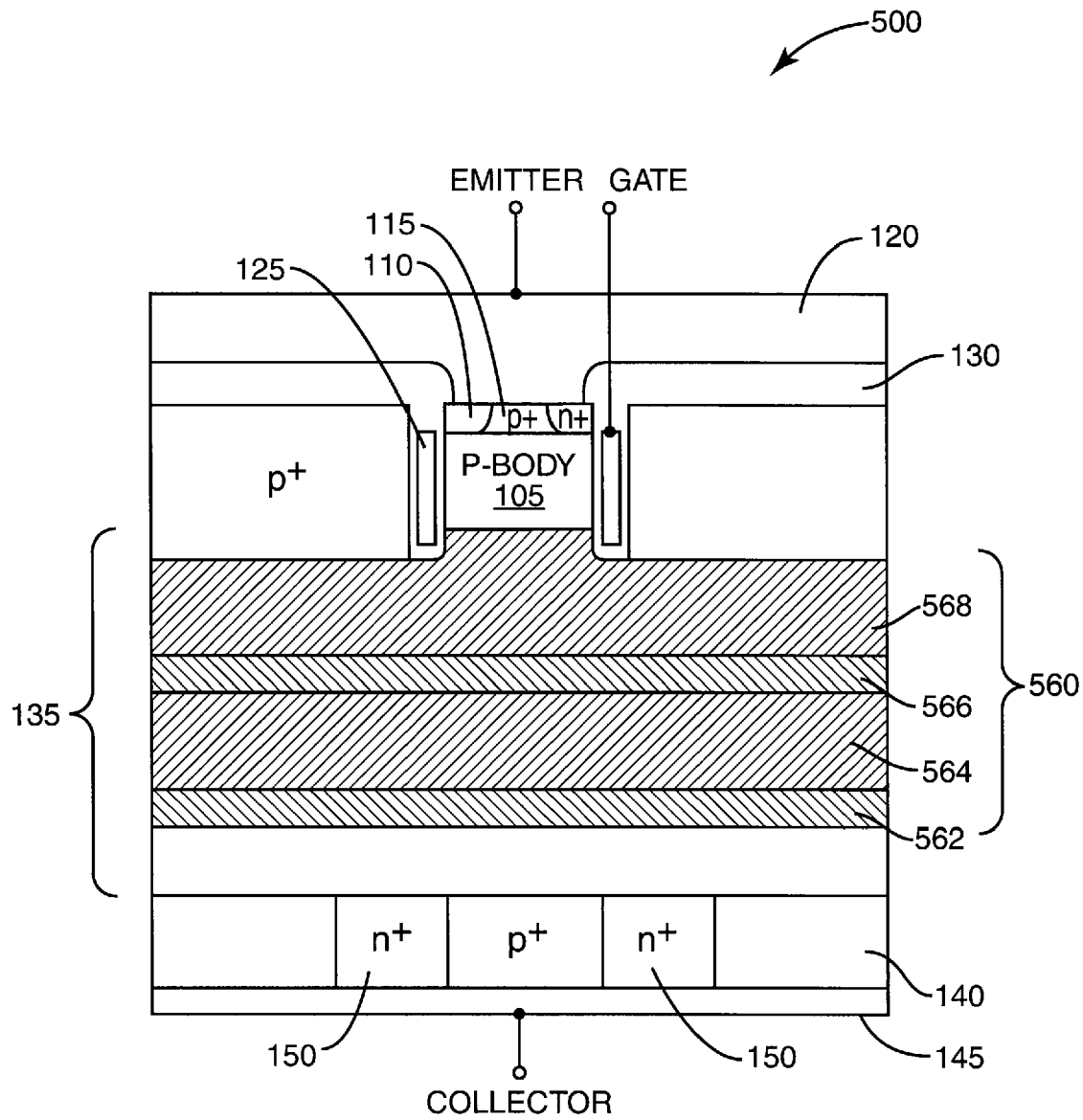
FIG. 5 is a block diagram of an embodiment of a power semiconductor device including an IGBT having an irradiation zone formed by multiple irradiation treatments.

FIG. 5 illustrates another embodiment of a power semiconductor device 500. According to this embodiment, the drift zone 135 is irradiated from the upper surface of the device 500 instead of from the lower surface to form an irradiation zone 560. The irradiation zone 560 includes a first end of range region 562 and a first reduced charge carrier concentration region 564 formed furthest from the irradiated upper surface of the device 500 during a first irradiation treatment. The irradiation zone 560 further includes a second end of range region 566 and a second reduced charge carrier concentration region 568 formed nearer to the irradiated surface during a second irradiation treatment. The device 500 may be subjected to additional irradiation treatments to form more reduced charge carrier concentration regions in the drift zone 135. The second end of range region 566 may be treated with an intensity of 25%-50% of the intensity used to form the first end of range region 562 as mentioned above. However, any other percentage may apply. Furthermore, the second end of range region 166 may also have a higher dose than the first end of range region 562. Thus, a reverse order in the location of the charge carrier lifetime minima may apply.

Figure 6:
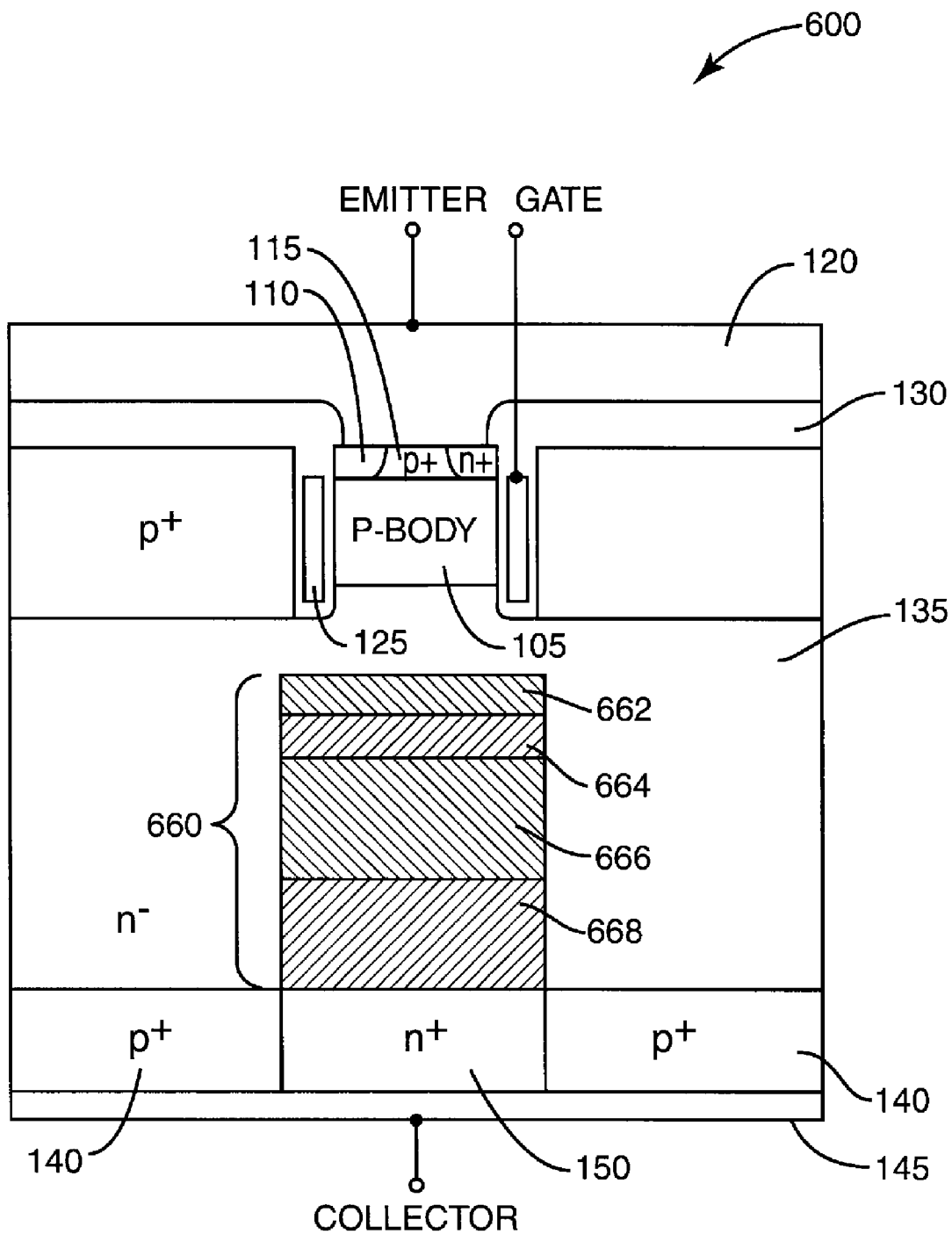
FIG. 6 is a block diagram of an embodiment of a power semiconductor device including an IGBT having an irradiation zone formed by multiple irradiation treatments.

FIG. 6 illustrates yet another embodiment of a power semiconductor device 600 in which the charge carrier lifetime reduction is performed only in the region of the drift zone 135 where the freewheeling diode is active. In this embodiment, during the irradiation treatment steps, a mask (not shown) is used to reduce the charge carrier lifetime of the drift zone 135 only in the approximate region in which the diode will be active. Particularly, the area of the regions 662, 664, 666, 668 of the irradiation zone 660 is approximately limited to the area within the drift zone 135 covered by the n+ regions 150 formed in the p+ collector contact region 140. Furthermore, the n+ regions 150 can cover a multiplicity of transistor cells with gate 125 and body region 105. There may be regions of other IGBTs without corresponding n+ regions 125 formed in the p+ collector contact region 140, i.e. without a freewheeling diode. In one embodiment, the irradiation treatment is masked in these regions.

Figure 7:
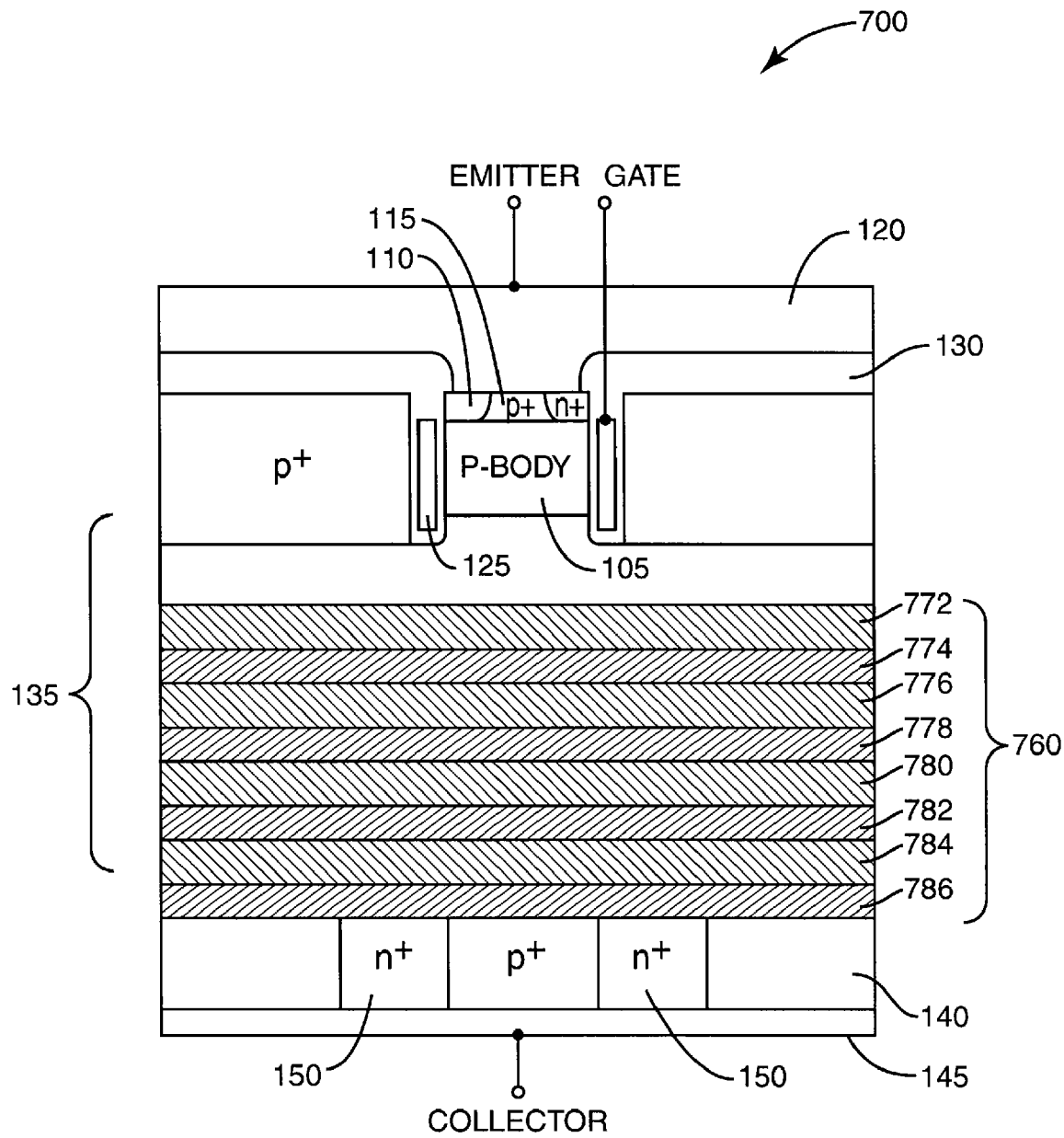
FIG. 7 is a block diagram of an embodiment of a power semiconductor device including an IGBT having an irradiation zone formed by multiple irradiation treatments.
Figure 8:
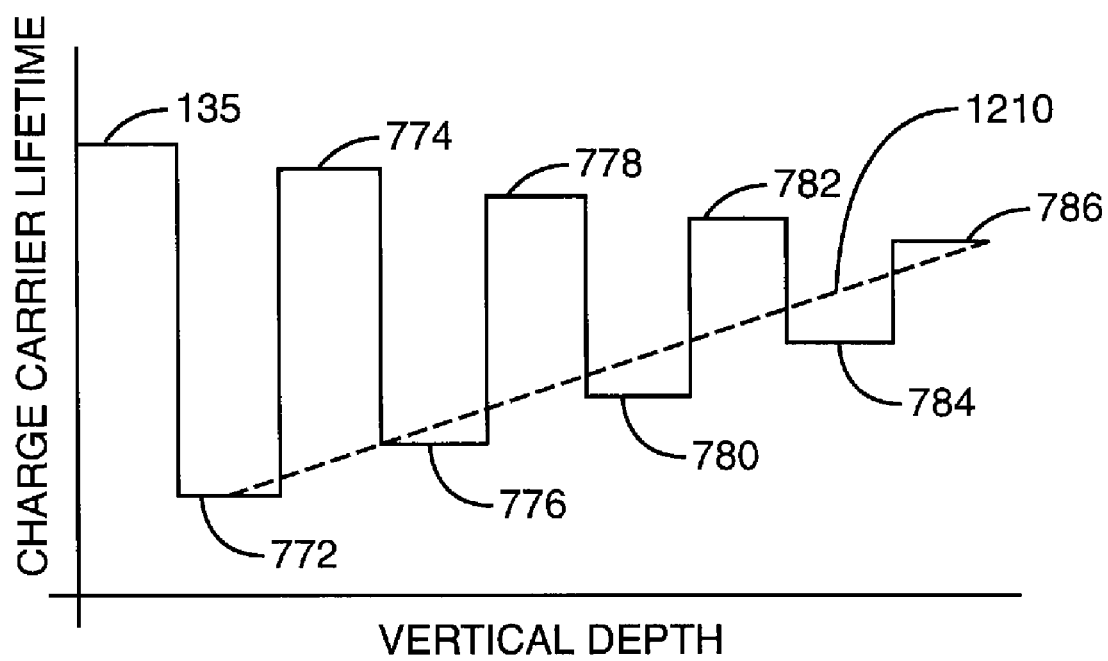
FIG. 8 is a plot diagram illustrating a charge carrier lifetime profile associated with the device of FIG. 7.

FIG. 7 shows still another embodiment of a power semiconductor device 700 subjected to four irradiation treatments, yielding an irradiation zone 760 having four end of range regions 772, 776, 780 and 784. A reduced charge carrier concentration region is arranged between adjacent end of range regions and between the irradiated surface (e.g., the bottom surface of the device 700 in this embodiment) and the end of range region 784 nearest the irradiated surface. Particularly, a first reduced charge carrier concentration region 774 is arranged between the two end of range regions 772 and 776 furthest from the irradiated surface and is irradiated only once. A second reduced charge carrier concentration region 778 is arranged between the next two adjacent end of range regions 776 and 780 and is irradiated twice. A third reduced charge carrier concentration region 782 is similarly arranged between end of range regions 780 and 784 and is irradiated three times. The reduced charge carrier concentration region 786 nearest the irradiated surface is arranged between the irradiated surface and the end of range region 784 nearest the irradiated surface. The regions 772-786 are consecutively arranged across the vertical depth of the drift zone 135, respectively. FIG. 8 shows an example of an associated charge carrier lifetime distribution for the different regions 772-786 of the power semiconductor device 700.

Figure 9:
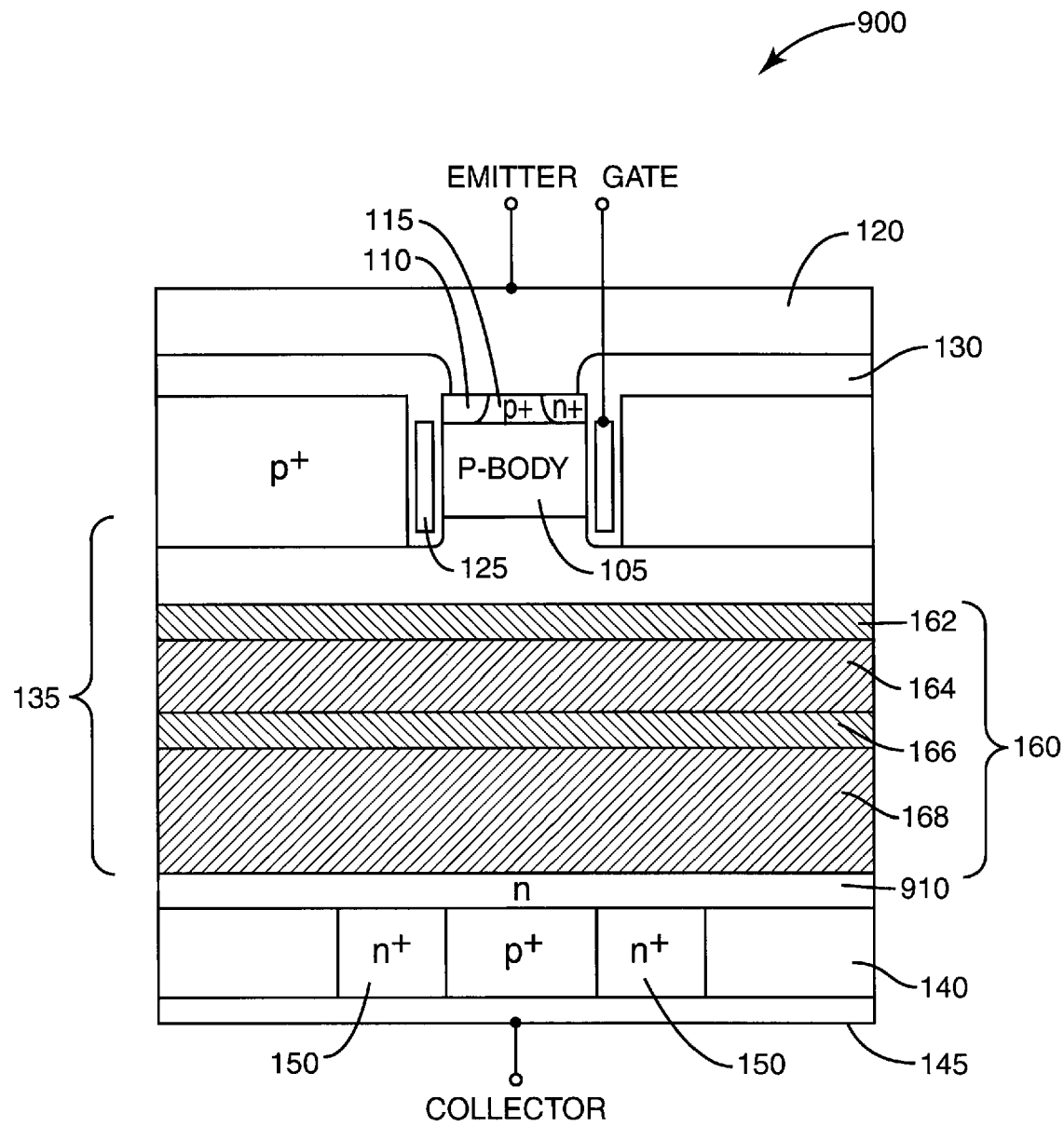
FIG. 9 is a block diagram of an embodiment of a power semiconductor device including an IGBT having an irradiation zone formed by multiple irradiation treatments.

FIG. 9 illustrates an embodiment of a power semiconductor device 900 having a field stop zone 910 arranged between the reduced charge carrier concentration region 168 nearest the irradiated surface (e.g., the bottom surface of the device 900 in this embodiment) and the p+ doped collector contact region 140. In one embodiment, the field stop zone 910 is in contact with the bottommost reduced charge carrier concentration region 168. The field stop zone 910 has a higher doping than that of the drift zone 135 and prevents the electric field that builds up during the blocking state from reaching the p+ doped collector contact region 140. Accordingly, the substrate thickness may be reduced. The high amount of charge stored by the freewheeling diode is compensated for by reducing the substrate thickness and by reducing the charge carrier lifetime of the drift zone 135 as described herein.

In one embodiment, the field stop zone 910 is created performing one or more proton irradiation steps from the substrate back side followed by a heat treatment between approximately 300-500° C. The heat treatment temperature range may be selected so that the proton irradiation has a doping effect in the form of donators as well as a charge carrier lifetime reduction. The recombination centers created by the heat treatment yield a desirable curvature/bending of the charge carrier profile wherein the selection of the profile of the field stop zone 910 allows for a reduction of the substrate thickness on one hand a soft diode turn-off behavior when commutating on the other hand. This particularly holds true when multiple proton implantations are performed from the substrate back side. In another embodiment, a single or multiple proton implantation is performed followed by annealing at a temperature T1 to generate the field stop zone 910. Next, one or more additional proton implantations are performed followed by a second annealing at a temperature T2 to create a recombination profile. In one embodiment, T1 is greater than T2.

Moreover, the diodes formed in part by the n+ regions 150 formed in the p+ collector contact region 140 may be arranged within a device with multiple transistor cells such that the effective diode area does not overlap with an edge termination structure (not shown). This arrangement prevents electron-hole plasma from occurring below the edge termination structure. Thus, an accumulation of holes beneath the edge termination structure is avoided when the freewheeling diode turns off, which would otherwise limit the safe operating area of the device 900 at high turn-off current.

Figure 10:
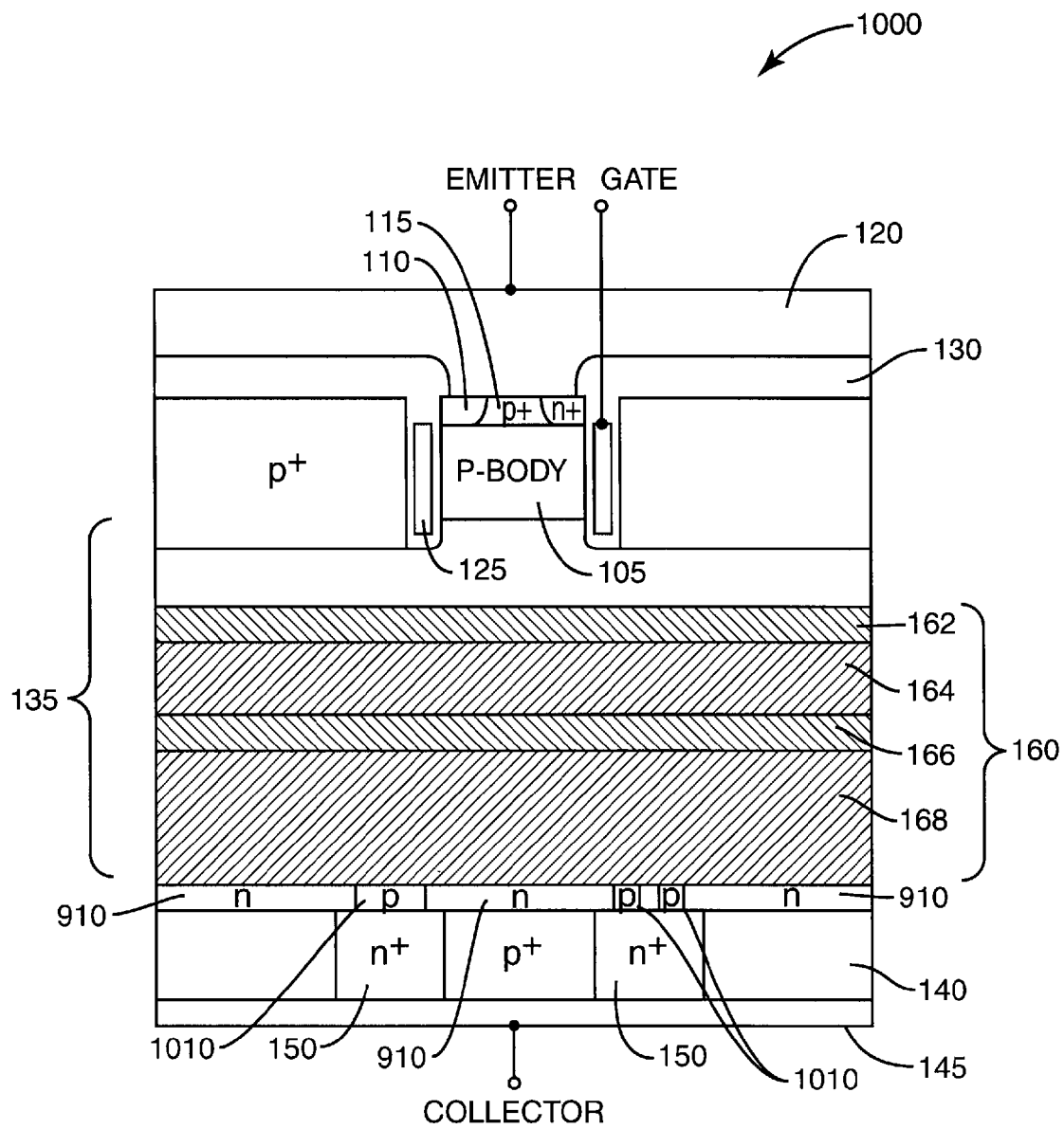
FIG. 10 is a block diagram of an embodiment of a power semiconductor device including an IGBT having an irradiation zone formed by multiple irradiation treatments.

The field stop zone 910 may be a continuous layer as shown in FIG. 9. Alternatively, one or more laterally-limited zones 1010 of p-type material can be interspersed throughout the field stop zone 910 as shown in FIG. 10. Each laterally-limited p-type zone 1010 is arranged above and in contact with one of the n+ regions 150 formed in the p+ collector contact region 140 as shown for example in FIG. 10. This arrangement provides a reduction of the emitter efficiency of the n+ regions 125, reducing the RRC. Nevertheless the diode softness will be improved. However, the emitter efficiency cannot be reduced without limit via the n implantation dose because a surface concentration of at least $5 \cdot 10^{19}$ cm$^{-3}$ is desired to form an ohmic contact. The laterally-limited p-type zones 1010 also lead to the creation of electron-hole pairs by avalanche multiplication at the p-n junction when the electric field is high. These additionally generated charges can cause a continuing current flow and a soft commutation behavior, wherein otherwise the depletion of stored charge would lead to a current tear-off.

Figure 11:
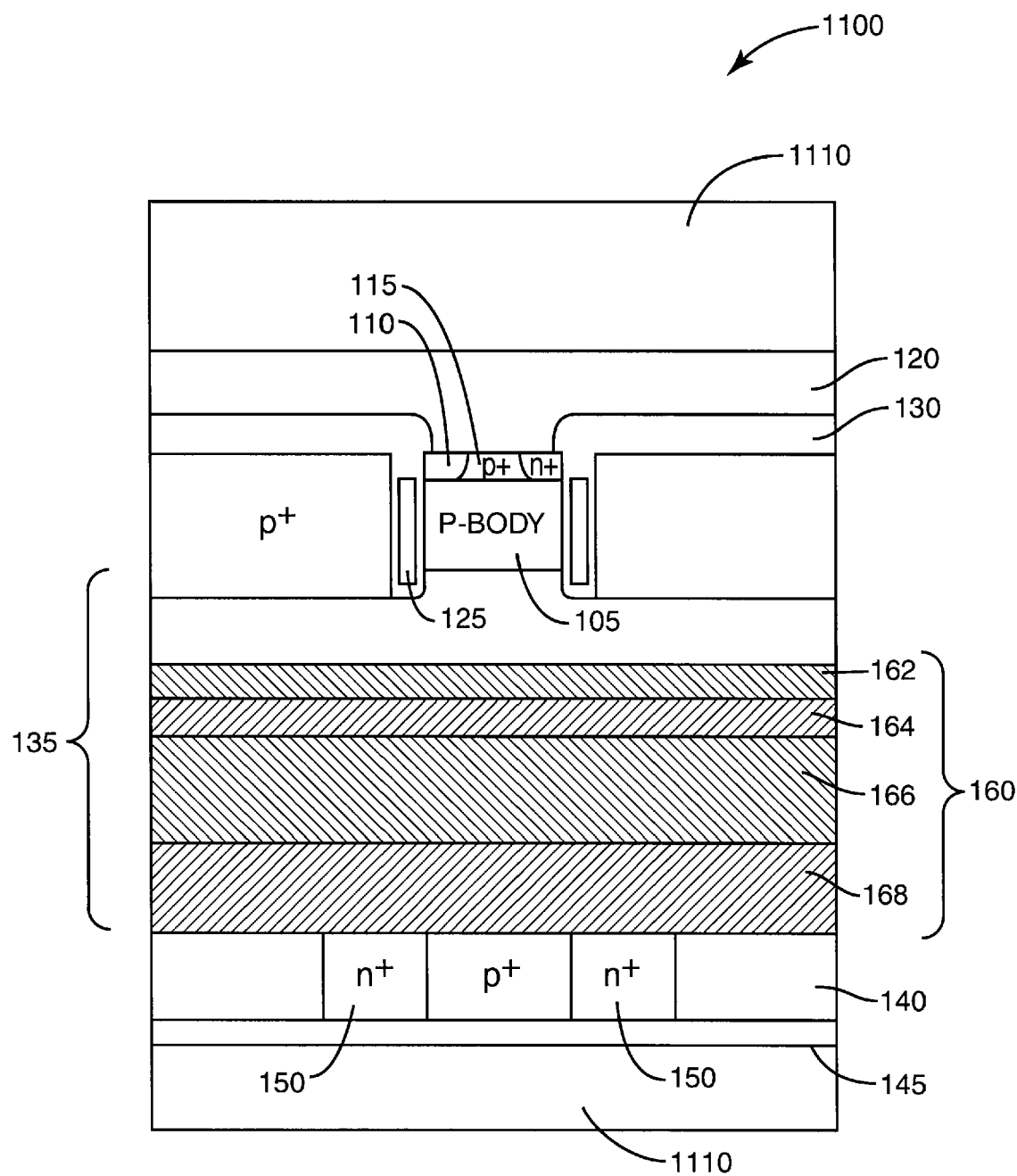
FIG. 11 is a block diagram of an embodiment of a power semiconductor device including an IGBT having an irradiation zone formed by multiple irradiation treatments.

FIG. 11 illustrates yet another embodiment of a power semiconductor device 1100 where a metal layer 1110 is formed on top of at least the front side and/or the back side of the device. According to one embodiment, the metal layer 1110 is a copper layer which is relatively thick, for example 20 μm in one embodiment. However, other metals can be used. In one embodiment, the metal layer is formed from any metal having a specific heat capacity at least approximately ⅔ that of copper. The thickness of each copper layer 1110 can be selected such that they serve not only as a mere metallization layer but also provide a sufficiently large heat capacity. Thus, the heat capacity could be at least 10% of the heat capacity of the silicon within the device 1100. The emitter contact layer 120 can also be part of the top copper layer 1110.

Forming the metal layer 1110 on top of at least the front side and/or the back side of the device 1100 provides for a very homogeneous current imprint, particularly for high current loads such as a surge current or a shorting of the IGBT. Moreover, the high heat capacity of the metal layer(s) 1110 allows for a temporary storage of dissipated energy. Thus, higher energy is needed to damage or destroy the power device 1100 after termination of a short circuit pulse. This increases the number of applications for which the power device 1100 may be used.

Figure 12:
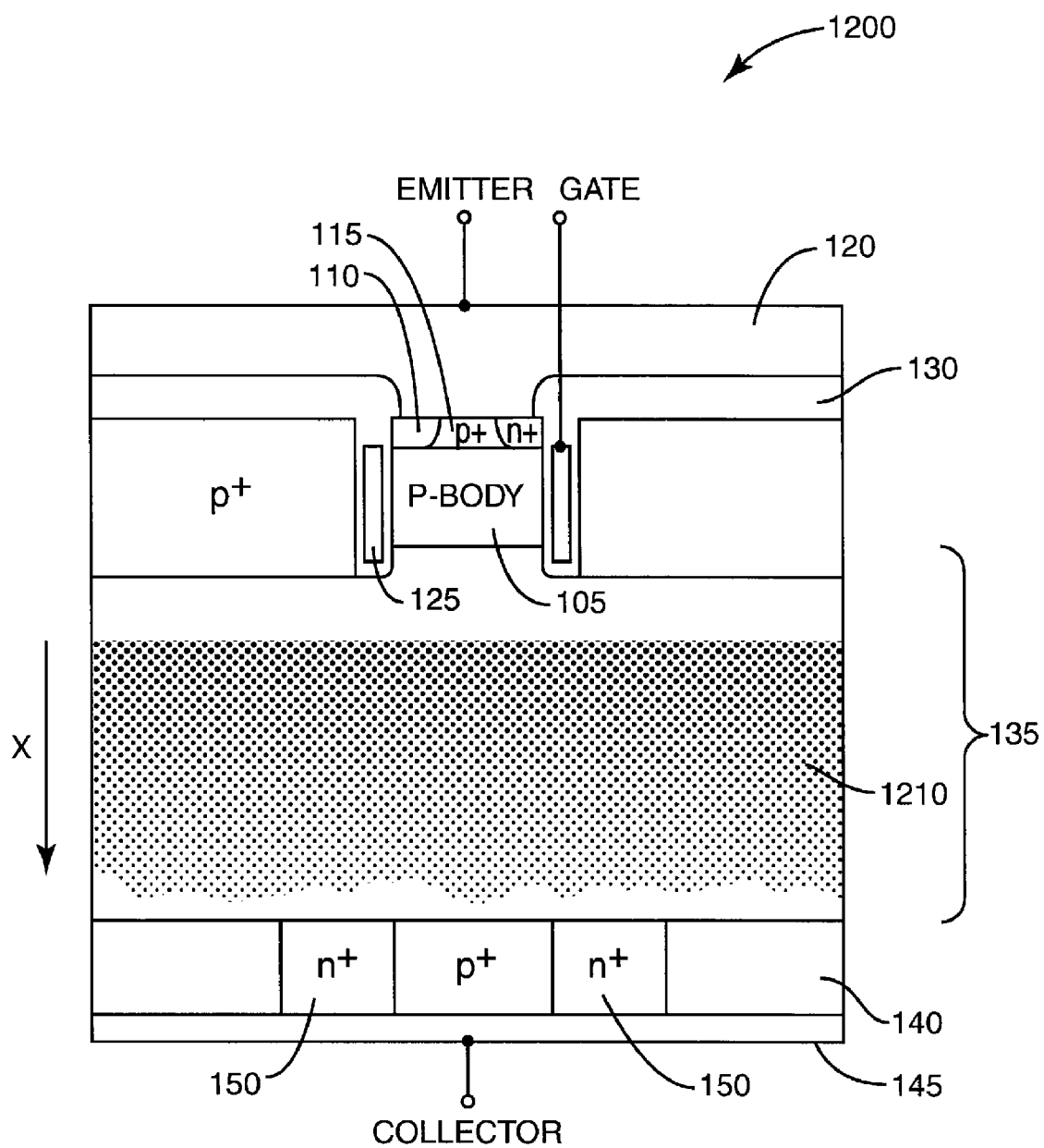
FIG. 12 is a block diagram of an embodiment of a power semiconductor device including an IGBT having an irradiation zone formed by multiple irradiation treatments.

FIG. 12 shows another embodiment of a power semiconductor device 1200 with a step-less reduced charge carrier concentration region 1210 formed in the drift zone 135. The region 1210 is step-less in that abrupt changes in charge carrier lifetime are not present in the region 1210. Instead, the step-less region 1210 has a continuously increasing charge carrier lifetime in the vertical direction indicated by line X. Charge carrier lifetime reduction is most prevalent near the p-n junction formed between the body region 105 and drift zone 135, gradually increasing in the vertical direction heading toward the device collector. This way, diode RRC is reduced without adversely affecting emitter efficiency as previously described herein. The step-less region 1210 may be formed in approximation by a plurality of local charge carrier reductions or a gradual or stepwise decrease in irradiation energy. The dashed line in FIG. 8 shows an example of a corresponding charge carrier lifetime profile.

Figure 13:
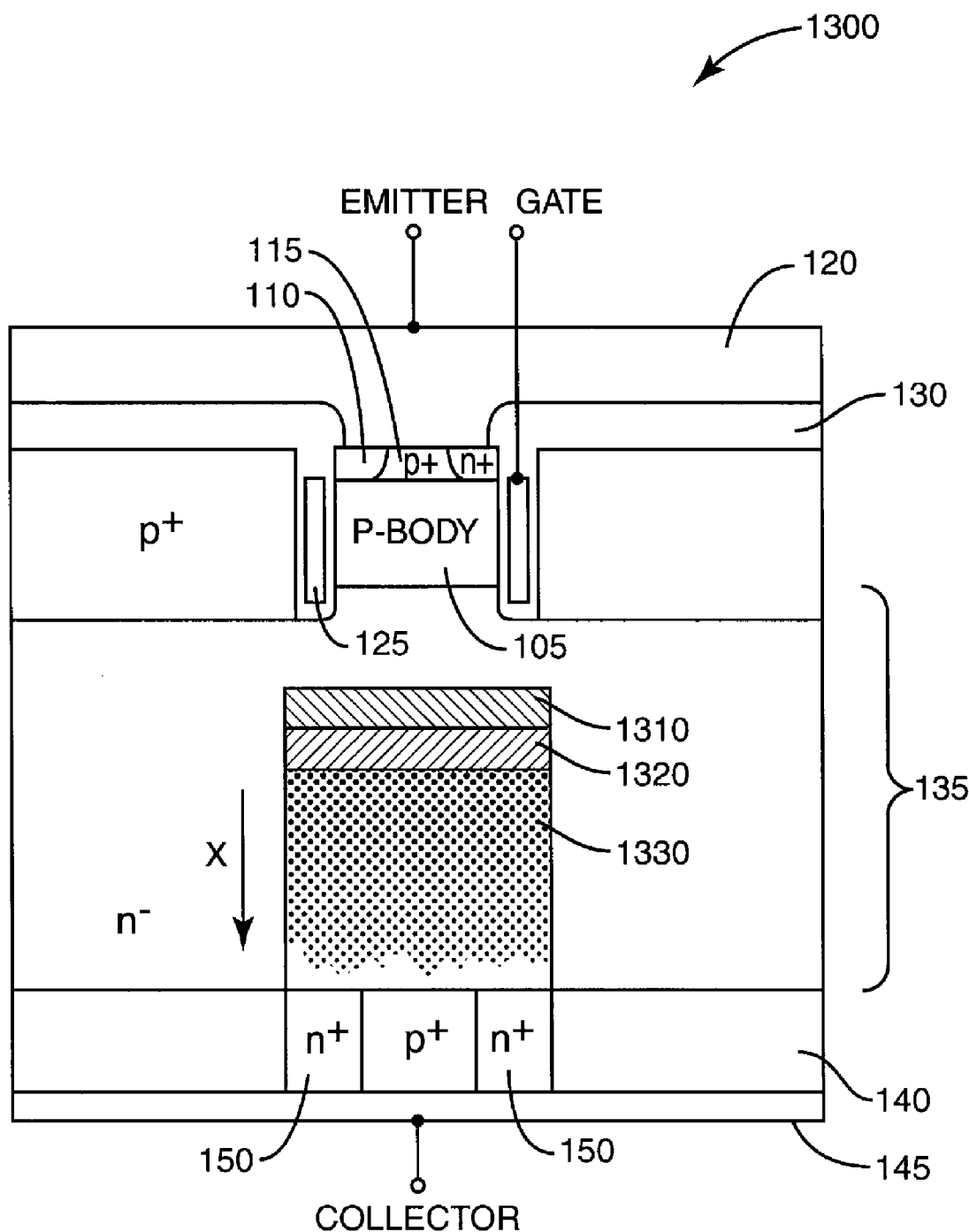
FIG. 13 is a block diagram of an embodiment of a power semiconductor device including an IGBT having an irradiation zone formed by multiple irradiation treatments.

FIG. 13 shows another embodiment of a power semiconductor device 1300 in which local charge carrier reduction regions 1310, 1320 near the front-side p-n junction side are combined with a step-less reduced charge carrier concentration region 1330. Step-less region 1330 can again be created by multiple regions as discussed above. This embodiment approaches the characteristic profile of a diode with homogeneous distribution of charge carrier lifetime for an RC-IGBT when in diode mode despite the strong emitter created by p+ region 115. Depending on the location of the step-less reduced charge carrier concentration region 1330, any suitable diode profile having a homogeneous charge carrier lifetime distribution can be approached.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
    an insulated-gate bipolar transistor having a body region of a first conductivity type, a gate arranged adjacent the body region, a first highly-doped contact region of the first conductivity type arranged in the body region and in contact with a top contact layer, a drift zone of a second conductivity type arranged below the body region, and a second highly-doped contact region of the first conductivity type arranged between the drift zone and a bottom contact layer;
    a diode having an anode at least partially formed by the body region and a cathode at least partially formed by one or more regions of the second conductivity type formed in the second highly-doped contact region; and
    an irradiation zone formed in the drift zone, the irradiation zone comprising at least two end of range regions and a reduced charge carrier lifetime region arranged between adjacent end of range regions and between a surface of the drift zone through which the irradiation zone is formed and the end of range region nearest the surface, wherein the reduced charge carrier lifetime regions and the end of range regions each have a charge carrier lifetime lower than that of a non-irradiated region of the drift zone.

2. The semiconductor device of claim 1, wherein the charge carrier lifetime of the end of range region arranged closest to the body region is lower than the charge carrier lifetime of the end of range region arranged closest to the second highly-doped contact region.

3. The semiconductor device of claim 2, wherein the charge carrier lifetime of the end of range region arranged closest to the body region is approximately the same as the charge carrier lifetime of the end of range region arranged closest to the second highly-doped contact region.

4. The semiconductor device of claim 2, wherein the charge carrier lifetime of the reduced charge carrier concentration region arranged closest to the body region is higher than the charge carrier lifetime of the reduced charge carrier concentration region arranged closest to the second highly-doped contact region.

5. The semiconductor device of claim 1, wherein the charge carrier lifetime of the end of range region arranged closest to the body region is higher than the charge carrier lifetime of the end of range region arranged closest to the second highly-doped contact region.

6. The semiconductor device of claim 5, wherein the charge carrier lifetime of the reduced charge carrier concentration region arranged closest to the body region is higher than the charge carrier lifetime of the reduced charge carrier concentration region arranged closest to the second highly-doped contact region.

7. The semiconductor device of claim 1, wherein the irradiation zone is limited to an area approximately within the drift zone where the diode is active.

8. The semiconductor device of claim 7, wherein the one or more regions of the second conductivity type formed in the second highly-doped contact region are limited to an area approximately within the second highly-doped contact region covered by the irradiation zone.

9. The semiconductor device of claim 1, further comprising a field stop zone of the second conductivity type arranged between the second highly-doped contact region and the end of range region arranged closest to the second highly-doped contact region.

10. The semiconductor device of claim 9, further comprising one or more laterally-limited zones of the first conductivity type embedded in the field stop zone over each region of the second conductivity type formed in the second highly-doped contact region.

11. A semiconductor device, comprising:
an insulated-gate bipolar transistor having a body region of a first conductivity type, a gate arranged adjacent the body region, a first highly-doped contact region of the first conductivity type arranged in the body region and in contact with a top contact layer, a drift zone of a second conductivity type arranged below the body region, and a second highly-doped contact region of the first conductivity type arranged between the drift zone and a bottom contact layer;
a diode having an anode at least partially formed by the body region and a cathode at least partially formed by one or more regions of the second conductivity type formed in the second highly-doped contact region;
a first end of range irradiation region formed in the drift zone below the body region;
a second end of range irradiation region formed in the drift zone below the first end of range irradiation region;
a first reduced charge carrier concentration region formed in the drift zone between the first and second end of range irradiation regions;
a second reduced charge carrier concentration region formed between a surface of the drift zone through which the end of range irradiation regions are formed and the end of range region nearest the surface; and
wherein the end of range irradiation regions and the reduced charge carrier concentration regions each have a charge carrier lifetime lower than a charge carrier lifetime of a non-irradiated region of the drift zone.

12. A method of fabricating a semiconductor device, comprising:
forming within a semiconductor substrate an insulated-gate bipolar transistor having a body region of a first conductivity type, a gate arranged adjacent the body region, a first highly-doped contact region of the first conductivity type arranged in the body region and in contact with a top contact layer, a drift zone of a second conductivity type arranged below the body region, and a second highly-doped contact region of the first conductivity type arranged between the drift zone and a bottom contact layer;
forming a diode having an anode at least partially formed by the body region and a cathode at least partially formed by one or more regions of the second conductivity type formed in the second highly-doped contact region; and
irradiating the drift zone to form at least two end of range regions in the drift zone and a reduced charge carrier lifetime region arranged between adjacent end of range regions and between a surface of the drift zone through which the drift zone is irradiated and the end of range region nearest the surface, wherein the reduced charge carrier lifetime regions and the end of range regions each have a charge carrier lifetime lower than that of a non-irradiated region of the drift zone.

13. The method of claim 12, wherein irradiating the drift zone comprises:
irradiating a back side of the semiconductor substrate to form one of the end of range regions in the drift zone closest to the body; and
irradiating the back side of the semiconductor substrate to form a different one of the end of range regions in the drift zone closest to the second highly-doped contact region.

14. The method of claim 12, wherein irradiating the drift zone comprises:
irradiating a front side of the semiconductor substrate to form one of the end of range regions in the drift zone closest to the body; and
irradiating the front side of the semiconductor substrate to form a different one of the end of range regions in the drift zone closest to the second highly-doped contact region.

15. The method of claim 12, wherein irradiating the drift zone comprises irradiating the semiconductor substrate so that the charge carrier lifetime of the end of range region arranged closest to the body region is lower than the charge carrier lifetime of the end of range region arranged closest to the second highly-doped contact region.

16. The method of claim 12, wherein irradiating the drift zone comprises irradiating the semiconductor substrate so that the charge carrier lifetime of the end of range region arranged closest to the body region is higher than the charge carrier lifetime of the end of range region arranged closest to the second highly-doped contact region.

17. The method of claim 12, further comprising forming a field stop zone of the second conductivity type between the second highly-doped contact region and the end of range region arranged closest to the second highly-doped contact region.

18. The method of claim 17, further comprising forming one or more laterally-limited zones of the first conductivity type in the field stop zone over each region of the second conductivity type formed in the second highly-doped contact region.

19. The method of claim 12, wherein irradiating the drift zone comprises irradiating the drift zone in an area where the diode is active.

* * * * *